United States Patent [19]
Byen et al.

[11] Patent Number: 5,432,548
[45] Date of Patent: Jul. 11, 1995

[54] APPARATUS FOR TESTING AND ADJUSTING AUDIO/VIDEO SIGNAL WAVEFORMS IN COLOR TELEVISION

[75] Inventors: Sang-Du Byen, Suwon-shi; Young-Min Lee, Seoul; Do-Young Kim, Suwon, all of Rep. of Korea

[73] Assignee: Samsung Electronics Co., Ltd., Suwon City, Rep. of Korea

[21] Appl. No.: 18,411

[22] Filed: Feb. 17, 1993

[30] Foreign Application Priority Data

Feb. 20, 1992 [KR] Rep. of Korea ............... 92-2583

[51] Int. Cl.⁶ .............................................. H04N 7/18
[52] U.S. Cl. ..................................... 348/180; 348/92; 348/126
[58] Field of Search ..................... 358/139, 10; N04N 17/00; 324/158 F; 348/92, 126, 180

[56] References Cited

U.S. PATENT DOCUMENTS 4,654,706  3/1987  Davidson et al. ............ 358/101 X
5,107,207  4/1992  Noyori ........................ 324/158 F R
5,216,504  6/1993  Webb et al. ...................... 358/139

FOREIGN PATENT DOCUMENTS 2-221875  9/1990  Japan.

Primary Examiner—Victor R. Kostak
Attorney, Agent, or Firm—Burns, Doane, Swecker & Mathis

[57] ABSTRACT

An apparatus for testing and adjusting audio/video signal waveforms in a color television, comprising a computer unit, a program logic controller, a measurement device, first and second interface units, a printed wiring board remote controller, an adjustment motor driving circuit, adjustment motors, an adjustment motor select circuit and an adjustment motor moving circuit. Therefore, according to the invention, the waveform test and adjustment for the printed wiring board are performed by the present apparatus, resulting in reduction in an inferiority rate and a labor cost in manufacturing the goods.

21 Claims, 9 Drawing Sheets

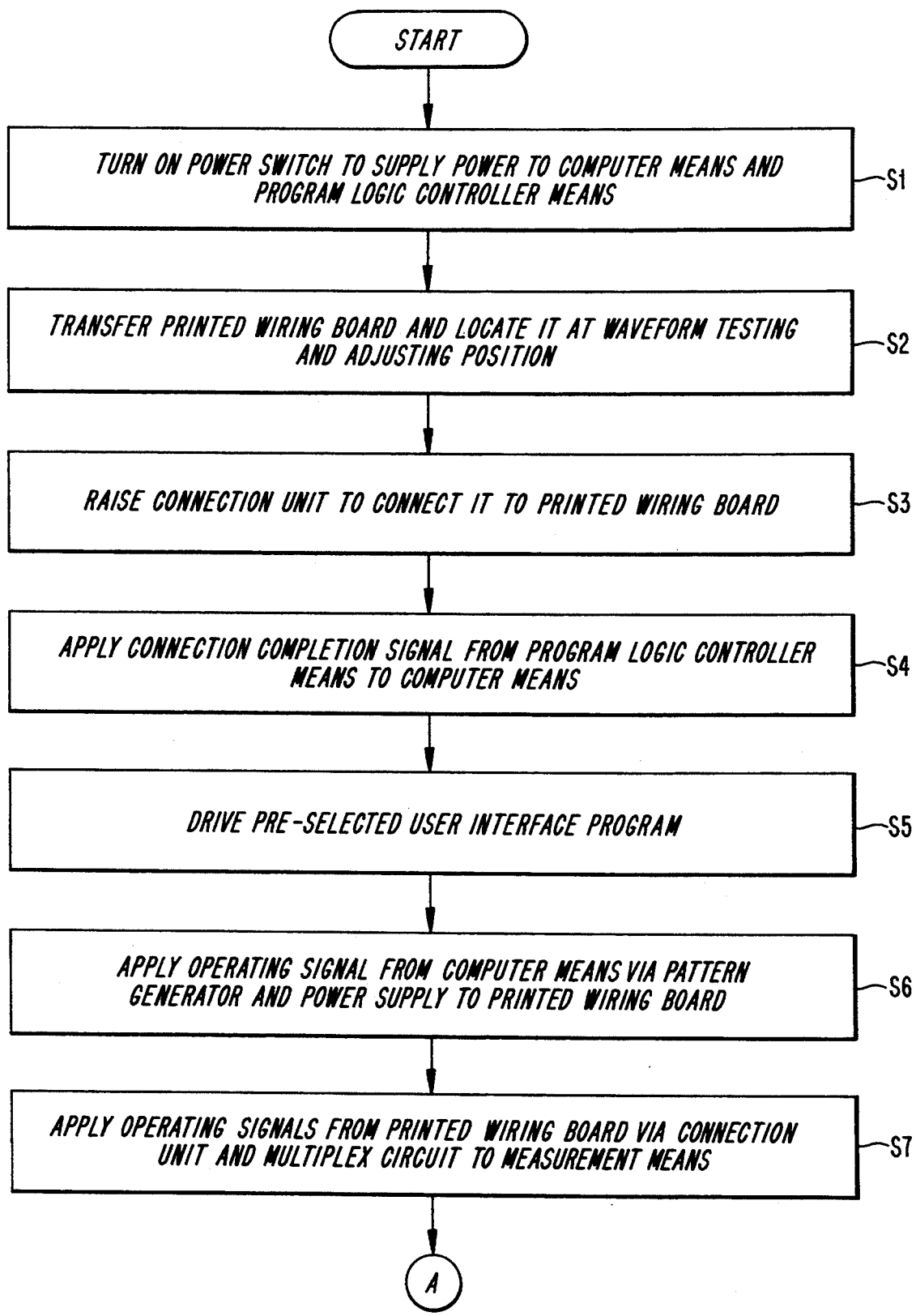

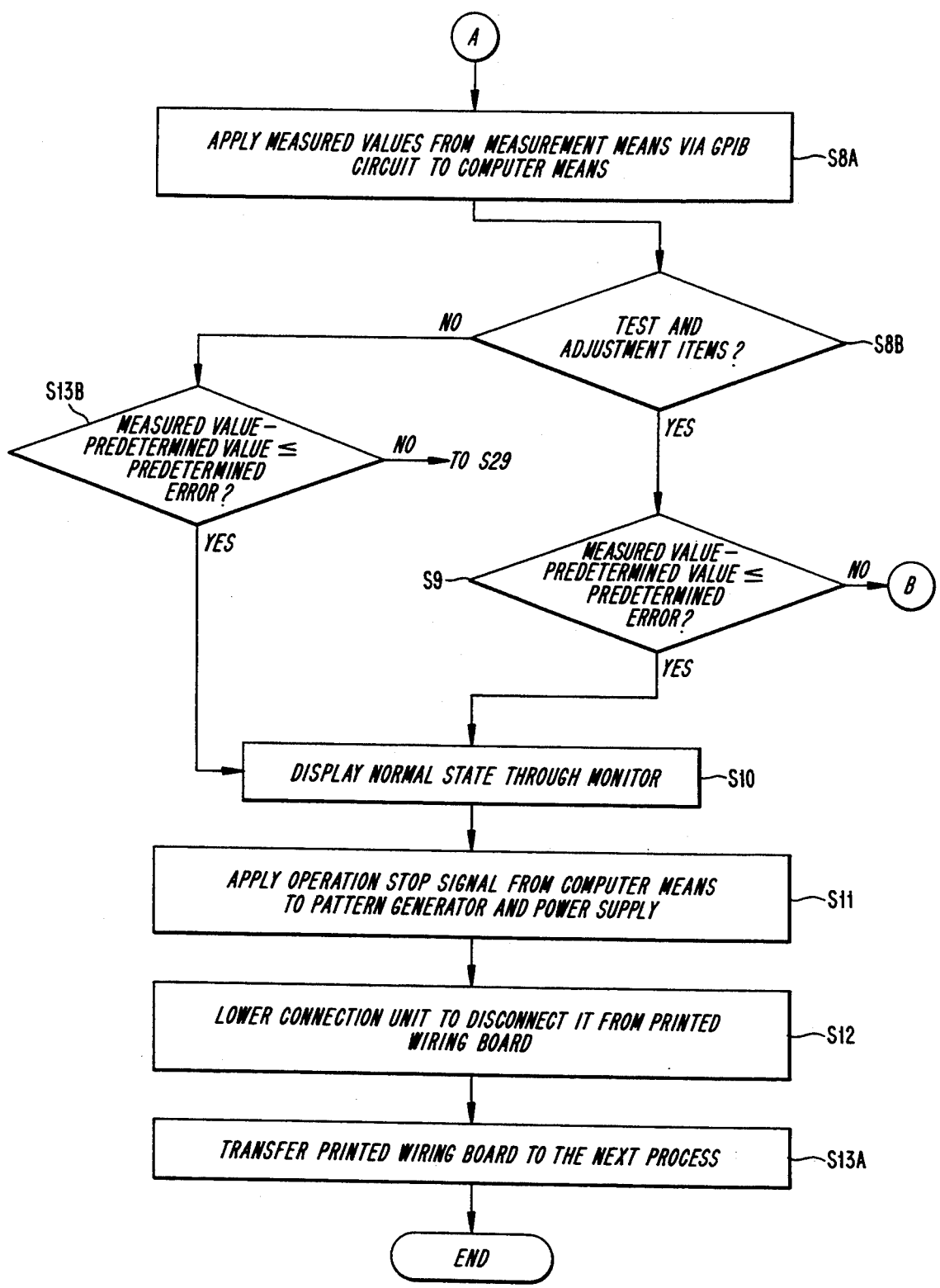

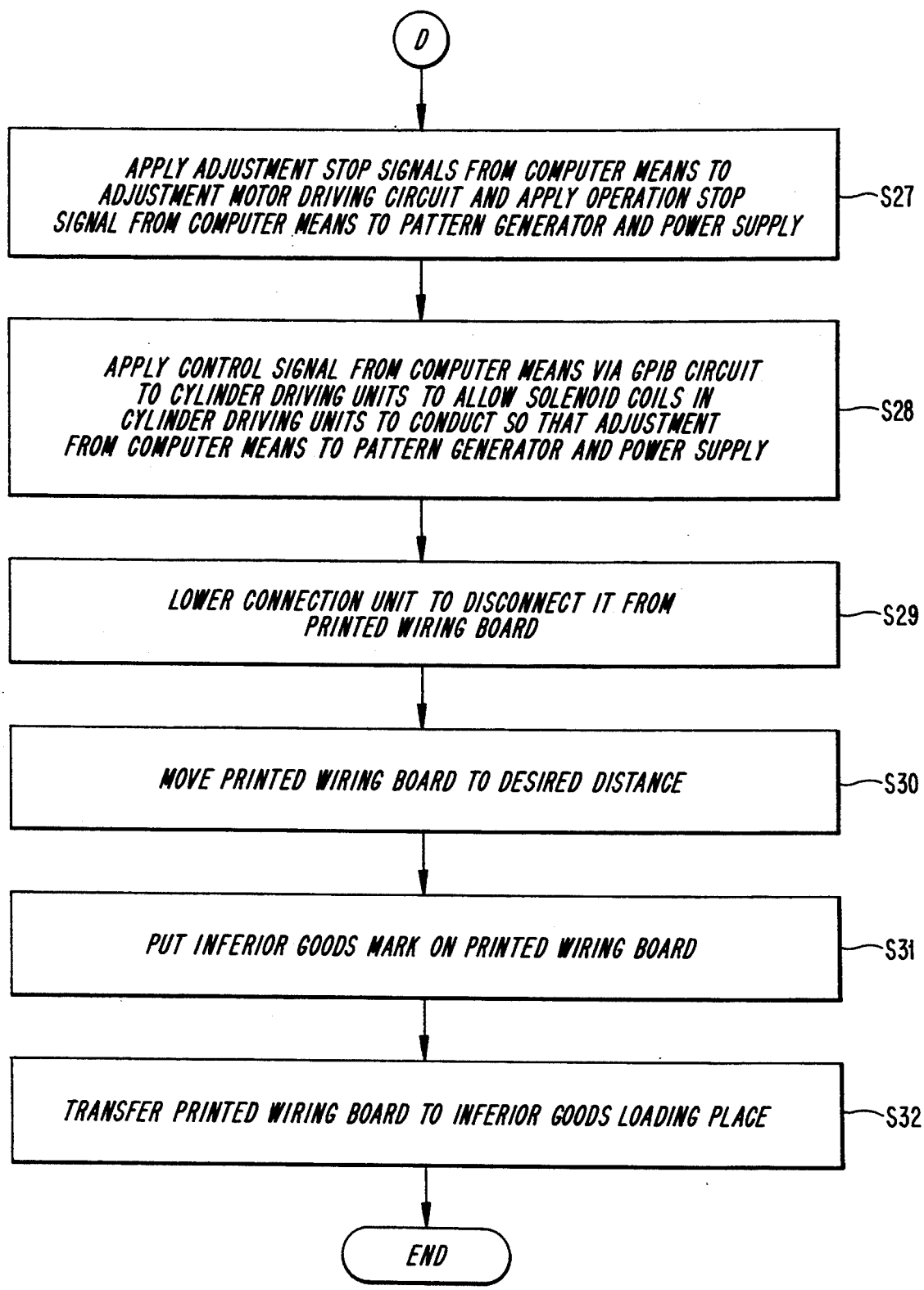

APPARATUS FOR TESTING AND ADJUSTING AUDIO/VIDEO SIGNAL WAVEFORMS IN COLOR TELEVISION

BACKGROUND OF THE INVENTION

1. Field of the Invention

The present invention relates to an apparatus for testing and adjusting audio/video signal waveforms in a color television.

2. Description of the Prior Art

Generally, in a color television, a test for audio/video signal waveforms has been made by measuring waveforms which are outputted from a printed wiring board in the form of direct current (DC), alternating current (At), a frequency signal and the like.

However, the conventional test process and the resulting adjustment for the audio/video signal waveforms in the color television have been manually performed. This results in irregularities in the quality of the manufactured goods, an increase in the inferiority rate thereof and an increase in labor cost.

A conventional apparatus for testing the audio/video signal waveforms in the color television is shown in Japanese Laid-Open Patent Publication No. Hei 2-221875 and in FIG. 6 herein. This conventional testing apparatus is desirable for automatically testing the audio/video signal waveforms in color television, but has the disadvantage of requiring manual adjustment of the audio/video signal waveforms in accordance with the test result by adjusting adjustment terminals on the printed wiring board resulting in the above problems.

In FIG. 6, the conventional testing apparatus is shown to comprise a controller 202, a floppy disk 204, display means 205, a target printed wiring board mount 206, an analyzer 208, a program oscilloscope 210 and a sequence controller 212.

SUMMARY OF THE INVENTION

The present invention has been made in view of the above problems, and it is an object of the present invention to provide an apparatus for testing and adjusting audio/video signal waveforms in color televisions wherein the inferiority rate of the manufactured goods and labor cost can be reduced.

In accordance with one aspect of the present invention, there is provided an apparatus for testing and adjusting audio/video signal waveforms in a color television, comprising: first key input means for inputting a user's command signal regarding transfer of a target printed wiring board from which the audio/video signal waveforms of the color television are outputted; program logic controller means responsive to the transfer command signal from said first key input means for operating a conveyor belt to locate said printed wiring board at a waveform testing and adjusting position; a connection unit being connected to said printed wiring board in cooperation with solenoid means when said printed wiring board is located at the waveform testing and adjusting position, said solenoid means being operated by said program logic controller means; first interface means for receiving from said program logic controller means a signal indicating that said connection unit and said printed wiring board have been interconnected; second interface means for receiving from said first interface means the signal indicating that said connection unit and said printed wiring board have been interconnected; computer means for receiving from said second interface means the signal indicating that said connection unit and said printed wiring board have been interconnected; second key input means for inputting a user's control command signal regarding the waveform test and adjustment for said printed wiring board and outputting the control command signal to said computer means; printed wiring board remote controller means for receiving a printed wiring board operation start command signal from said computer means via said second interface means and operating said printed wiring board via said connection unit in response to the operation start command signal; measurement means for receiving operated signals from said printed wiring board via said connection unit and said first interface means when said printed wiring board is operated and outputting measured values of the operated signals from said printed wiring board to said computer means via said second interface means; an adjustment motor driving circuit for receiving adjustment signals from said computer means via said second interface means, the adjustment signals each corresponding to a difference value when a corresponding one of the measured values of the operated signals from said printed wiring board is different from a corresponding predetermined value preset in said computer means; a plurality of adjustment motors each being rotated in response to a corresponding one of rotation signals from said adjustment motor driving circuit to rotate a corresponding one of a plurality of adjustment terminals on said printed wiring board corresponding to a difference value when a corresponding one of the measured values of the operated signals from said printed wiring board is different from a corresponding predetermined value preset in said computer means; and adjustment motor select means for receiving an adjustment motor select signal from said computer means when at least one of the measured values of the operated signals from said printed wiring board is different from a corresponding predetermined value preset in said computer means, selecting one of said adjustment motors corresponding to a position of said printed wiring board to be adjusted, in response to the adjustment motor select signal, and connecting the selected adjustment motor to said printed wiring board.

In accordance with another aspect of the present invention, there is provided an apparatus for testing and adjusting audio/video signal waveforms in a color television, comprising: first key input means for inputting a user's command signal regarding transfer of a target printed wiring board from which the audio/video signal waveforms of the color television are outputted; program logic control let means responsive to the transfer command signal from said first key input means for operating a conveyor belt to locate said printed wiring board at a waveform testing and adjusting position; a connection unit being connected to said printed wiring board in cooperation with solenoid means when said printed wiring board is located at the waveform testing and adjusting position, said solenoid means being operated by said program logic controller means; first interface means for receiving from said program logic controller means a signal indicating that said connection unit and said printed wiring board have been interconnected; second interface means for receiving from said first interface means the signal indicating that said connection unit and said printed wiring board have been interconnected; computer means for receiving from said second interface means the signal indicating that said connection unit and said printed wiring board have been interconnected; second key input means for inputting a user's control command signal regarding the waveform test and adjustment for said printed wiring board and outputting the control command signal to said computer means; printed wiring board remote controller means for receiving a printed wiring board operation start command signal from said computer means via said second interface means and operating said printed wiring board via said connection unit in response to the operation start command signal; measurement means for receiving operated signals from said printed wiring board via said connection unit and said first interface means when said printed wiring board is operated and outputting measured values of the operated signals from said printed wiring board to said computer means via said second interface means; an adjustment motor driving circuit for receiving adjustment signals from said computer means via said second interface means, the adjustment signals each corresponding to a difference value when a corresponding one of the measured values of the operated signals from said printed wiring board is different from a corresponding predetermined value preset in said computer means; a plurality of adjustment motors each being rotated in response to a corresponding one of rotation signals from said adjustment motor driving circuit to rotate a corresponding one of a plurality of adjustment terminals on said printed wiring board corresponding to a difference value when a corresponding one of the measured values of the operated signals from said printed wiring board is different from a corresponding predetermined value preset in said computer means; adjustment motor select means for receiving an adjustment motor select signal from said computer means when at least one of the measured values of the operated signals from said printed wiring board is different from a corresponding predetermined value preset in said computer means, selecting one of said adjustment motors corresponding to a position of said printed wiring board to be adjusted, in response to the adjustment motor select signal, and connecting the selected adjustment motor to said printed wiring board; and adjustment motor moving means for receiving a position signal from said computer means when at least one of the measured values of the operated signals from said printed wiring board is different from a corresponding predetermined value preset in said computer means and moving a corresponding one of said adjustment motors to a position of said printed wiring board to be adjusted, in response to the position signal.

BRIEF DESCRIPTION OF THE DRAWINGS

The above and other objects, features and advantages of the present invention will be more clearly understood from the following detailed description taken in conjunction with the accompanying drawings, in which:

FIGS. 5A-5E form a flowchart illustrating an operation of the apparatus in accordance with the embodiment of the present invention.

DETAILED DESCRIPTION OF THE PREFERRED EMBODIMENTS

Figure 1:
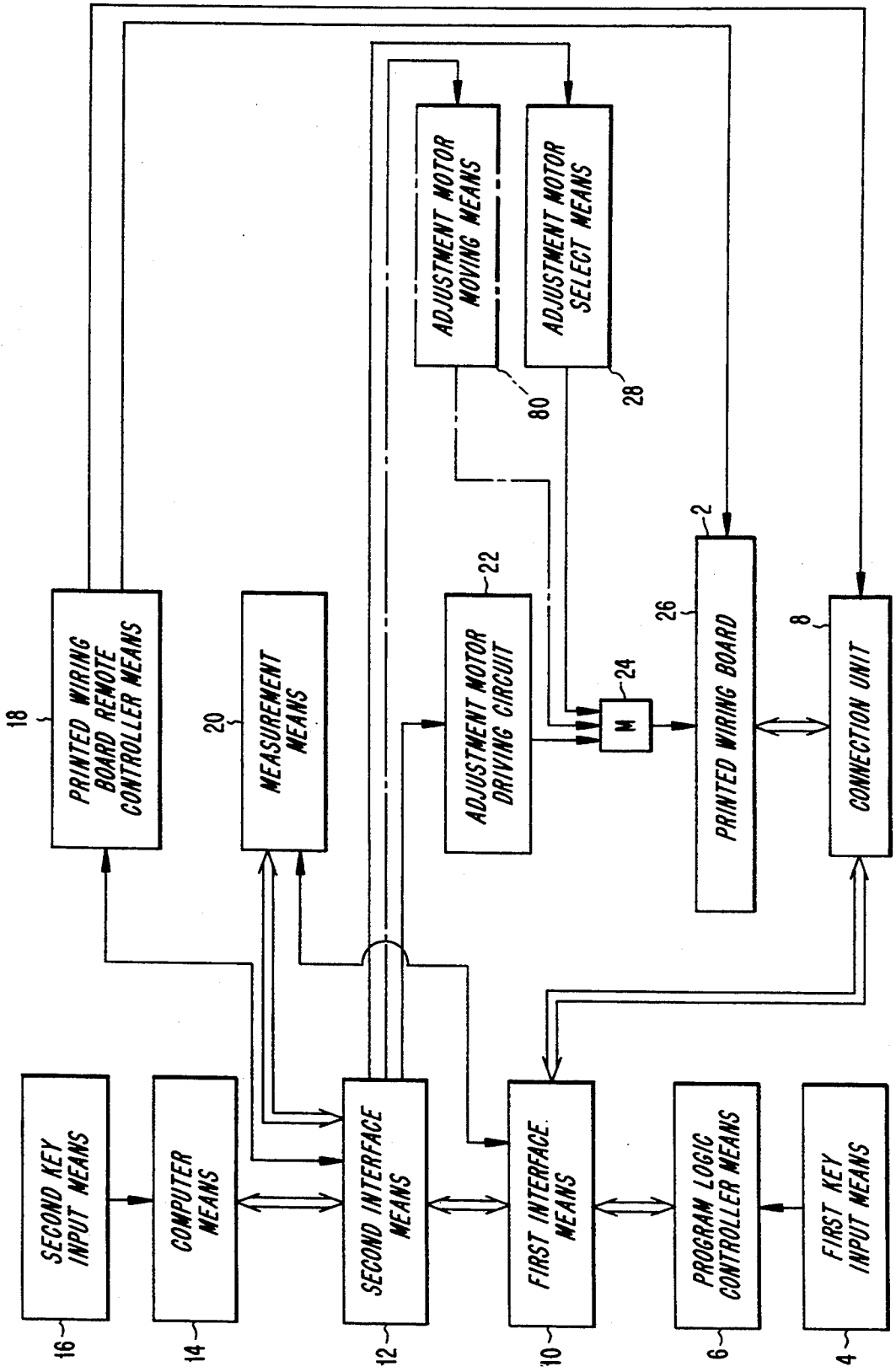
FIG. 1 is a block diagram of an apparatus for testing and adjusting audio/video signal waveforms in a color television in accordance with an embodiment of the present invention.

Referring to FIG. 1, there is shown a block diagram of an apparatus for testing and adjusting audio/video signal waveforms in a color television in accordance with an embodiment of the present invention. As shown in this drawing, the apparatus of the present invention comprises first key input means 4 for inputting a user's command signal regarding transfer of a target printed wiring board 2 from which the audio/video signal waveforms of the color television are outputted and program logic controller means 6 responsive to the transfer command signal from the first key input means 4 for operating a conveyor belt to locate the printed wiring board 2 at a waveform testing and adjusting position.

A connection unit 8 is connected to the printed wiring board 2 in cooperation with solenoid means when the printed wiring board 2 is located at the waveform testing and adjusting position, the solenoid means being operated by the program logic controller means 6.

The apparatus of the present invention also comprises first interface means 10 for receiving from the program logic controller means 6 a signal indicating that the connection unit 8 and the printed wiring board 2 have been interconnected, second interface means 12 for receiving from the first interface means 10 a signal indicating that the connection unit 8 and the printed wiring board 2 have been interconnected, and computer means 14 for receiving from the second interface means 10 a signal indicating that the connection unit 8 and the printed wiring board 2 have been interconnected.

Second key input means 16 is provided to input a user's control command signal regarding the waveform test and adjustment for the printed wiring board 2 and to output a control command signal to the computer means 14, so that software programs including a user interface program, a file management program, a product management program and a test and adjustment apparatus program are configured in the computer means 14. In the test and adjustment apparatus program, there are set environments of modules in the test and adjustment apparatus.

The apparatus of the present invention also comprises printed wiring board remote controller means 18 for receiving a printed wiring board operation start command signal from the computer means 14 via the second interface means 12 and operating the printed wiring board 2 via the connection unit 8 in response to the operation start command signal; measurement means 20 for receiving operation signals from the printed wiring board 2 via the connection unit 8 and the first interface means 10 when the printed wiring board 2 is operated and outputting measured values of the operation signals from the printed wiring board 2 to the computer means 14 via the second interface means 12; and an adjustment motor driving circuit 22 for receiving adjustment signals from the computer means 14 via the second interface means 12, the adjustment signals each corresponding to a difference value when a corresponding one of the measured values of the operation signals from the printed wiring board 2 is different from a corresponding predetermined value preset in the computer means 14.

Each of a plurality of adjustment motors 24 is rotated in response to a corresponding rotation signal from the adjustment motor driving circuit 22 to rotate a corresponding one of a plurality of adjustment terminals 26 on the printed wiring board 2 corresponding to a difference value when a corresponding one of the measured values of the operation signals from the printed wiring board 2 is different from a corresponding predetermined value preset in the computer means 14.

Adjustment motor select means 28 is also provided to receive an adjustment motor select signal from the computer means 14 when at least one of the measured values of the operation signals from the printed wiring board 2 is different from a corresponding predetermined value preset in the computer means 14, to select one of the adjustment motors 24 corresponding to a position of the printed wiring board 2 to be adjusted, in response to the adjustment motor select signal, and to connect the selected adjustment motor 24 to the printed wiring board 2.

Figure 2:
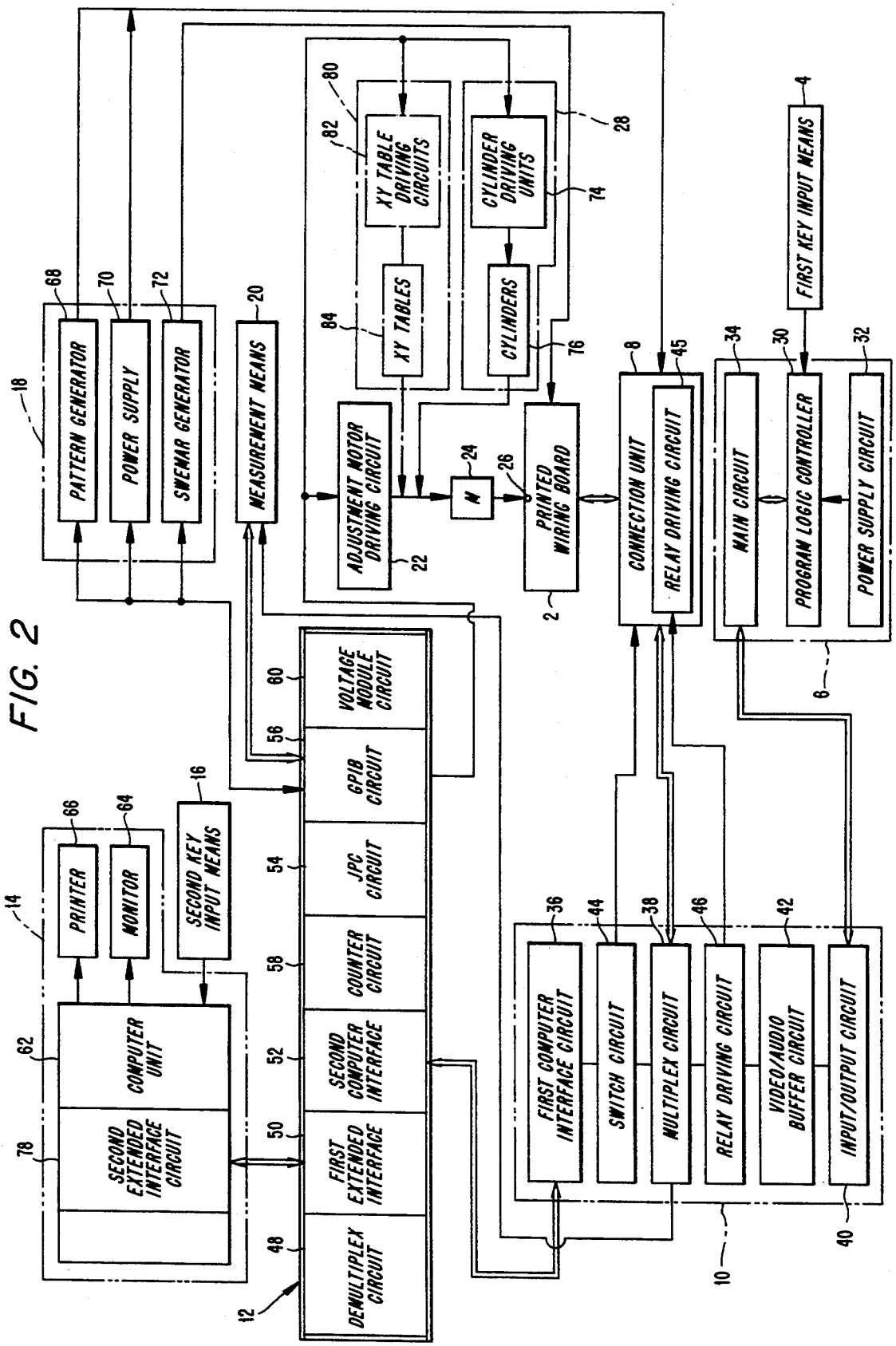
FIG. 2 is a detailed block diagram of the apparatus in FIG. 1.

Referring to FIG. 2, there is shown a detailed block diagram of the apparatus in FIG. 1. As shown in this drawing, the program logic controller means 6 includes a program logic controller 30 for receiving the user's printed wiring board transfer command signal from the first key input means 4 and outputting a control signal to operate the conveyor belt and the connection unit 8 in response to the transfer command signal; a power supply circuit 32 for supplying DC power to the program logic controller 30; and a main circuit 34 for setting an operating condition of the program logic controller 30, transferring the control signal from the program logic controller 30 to the first interface means 10 and transferring system operated signals from the first interface means 10 to the program logic controller 30.

Figure 4:
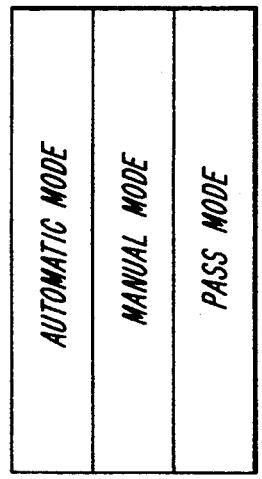
FIG. 4 shows a configuration of software programs stored in a program logic controller in FIG. 2.
Figure 5C:
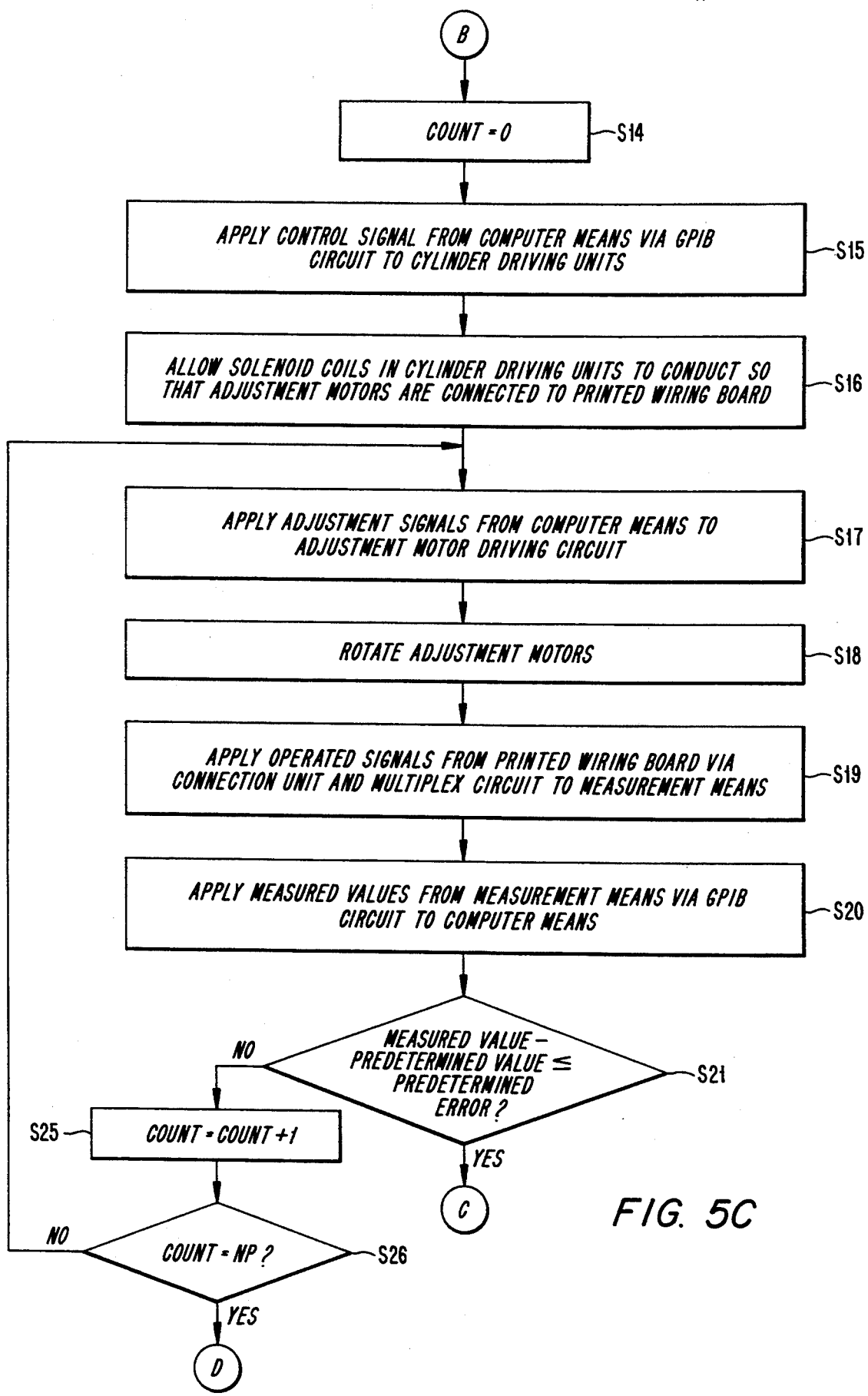
Figure 5D:
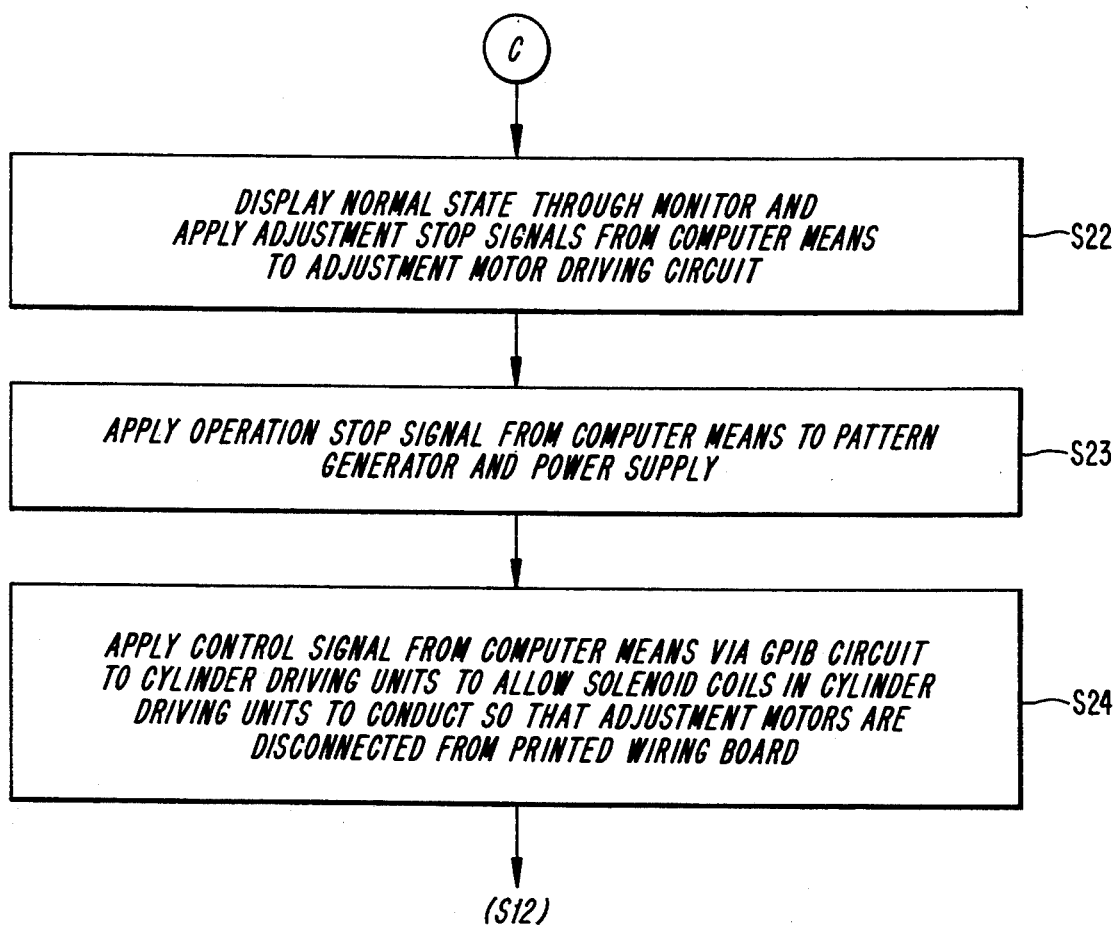
Figure 6:
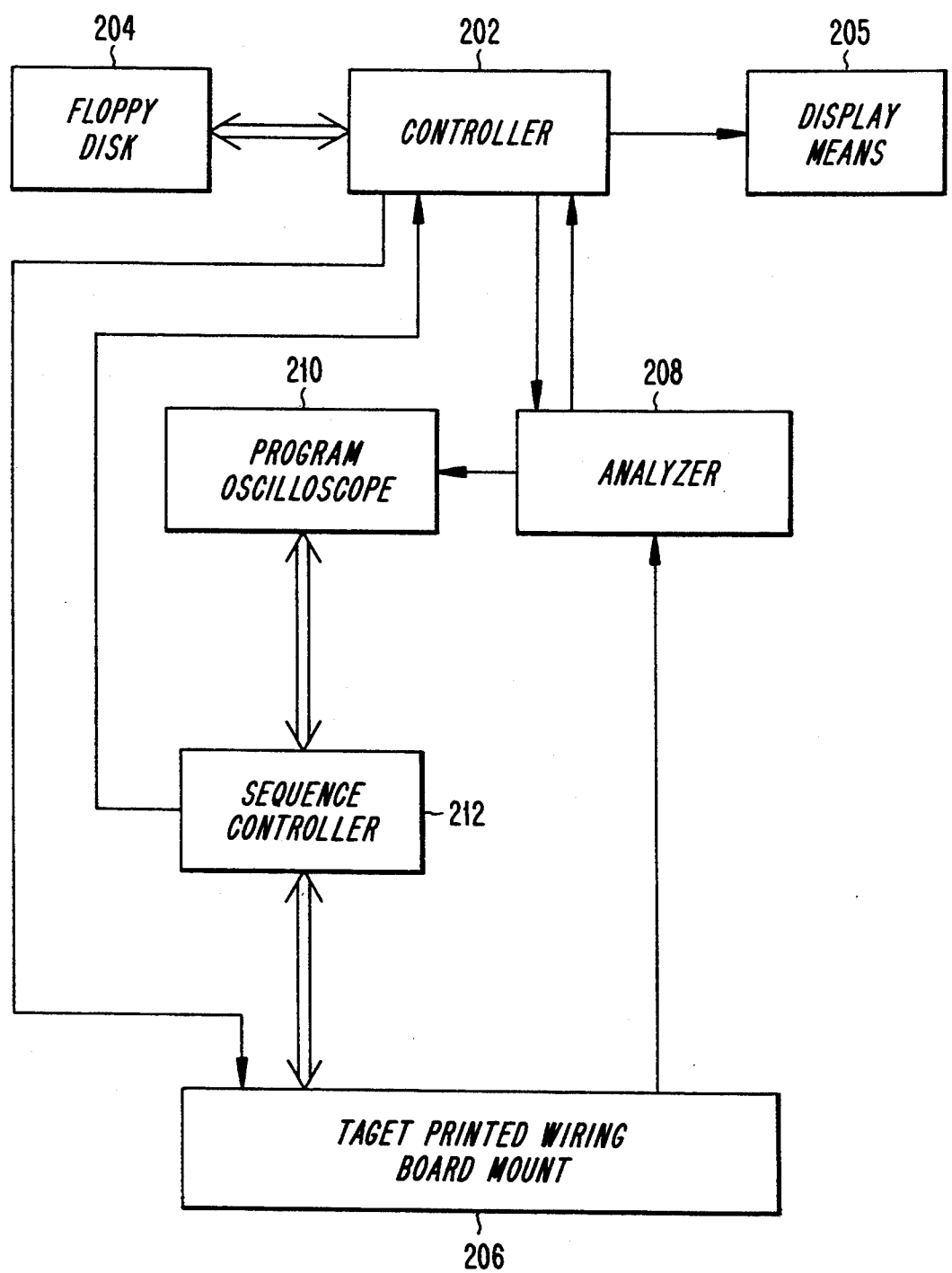
FIG. 6 is a block diagram of an apparatus for testing and adjusting audio/video signal waveforms in a color television in accordance with the prior art.

Three kinds of programs are stored in the program logic controller 30 as shown in FIG. 4. The first program is a pass mode program for transferring the printed wiring board 2 directly to the next process without the waveform test and adjustment in the case where the system model is changed or the system is under repair. The second program is an automatic mode program for executing through software the waveform test and adjustment for the printed wiring board 2 utilizing the computer means 14 and the program logic controller means 6. The third program is a manual mode program for manual testing of the printed wiring board 2 located at the waveform testing and adjusting position utilizing the program logic controller means 6.

The first interface means 10 includes a first computer interface circuit 36 for interfacing circuits in the first interface means 10 to the computer means 14; a multiplex circuit 38 for selecting at least one of a plurality of contacts of the printed wiring board 2 in response to a control signal from the computer means 14, outputting a signal indicative of the selected contact to the connection unit 8 and transferring to the measurement means 20 the operation signals which are outputted from the printed wiring board 2 via the connection unit 8; and an input/output circuit 40 for receiving the control signal from the program logic controller means 6 and outputting the system operated signals to the program logic controller means 6.

The first interface means 10 is also provided with a video/audio buffer circuit 42 for amplifying video/audio adjustment condition signals from the computer means 14 and outputting the amplified signals to the connection unit 8; a switch circuit 44 responsive to the control signal from the computer means 14 for operating switches to connect circuit components for setting particular adjustment conditions to the contacts of the printed wiring board 2; and a relay driving circuit 46 responsive to the control signal from the computer means 14 for operating a relay driving circuit 45 in the connection unit 8 to connect the circuit components for setting the particular adjustment conditions to the contacts of the printed wiring board 2.

The second interface means 12 includes a demultiplex circuit 48 for communicating with the multiplex circuit 38 in the first interface means 10; a first extended interface circuit 50 for communicating with a second extended interface circuit 78 included in a computer unit 62 in the computer means 14 to transfer the control signal from the computer means 14 to other circuits in the second interface means 12; a second computer interface circuit 52 for communicating with the first computer interface circuit 36 in the first interface means 10; a joint position controller (JPC) circuit 54 responsive to the control signal from the computer means 14 for outputting the adjustment motor select signals to rotate the adjustment motors 24 selected by the computer means 14; and a general purpose interface bus (GPIB) circuit 56 for transferring the adjustment motor select signals from the JPC circuit 54 to the adjustment motor select means 28, transferring the printed wiring board operation start command signal from the computer means 14 to the printed wiring board remote controller means 18 and the measurement means 20 and transferring the measured values of the printed wiring board operated signals from the measurement means 20 to the computer means 14.

The second interface means 12 is also provided with a counter circuit 58 for transferring the measured values of the printed wiring board operated signals from the measurement means 20 to the computer means 14 when the measured values are signals of high frequency and a voltage module circuit 60 for receiving the operated signals from the printed wiring board 2 directly, not through the measurement means 20, for the reduction of time when the operated signals are voltage signals of low frequency and outputting the operated signals to the computer means 14.

The computer means 14 includes the computer unit 62 for receiving from a program logic controller means 6 through the first and second interface means 10 and 12 the signal indicating that the connection unit 8 and the printed wiring board 2 have been interconnected and controlling all of the waveform test and adjustment for the printed wiring board 2; a monitor 64 for receiving a signal as a result of the waveform test for the printed wiring board 2 from the computer unit 62 and displaying the received signal as a video; and a printer 66 for receiving data as a result of the waveform test and adjustment for the printed wiring board 2 from the computer unit 62 and printing the received data.

Figure 3:
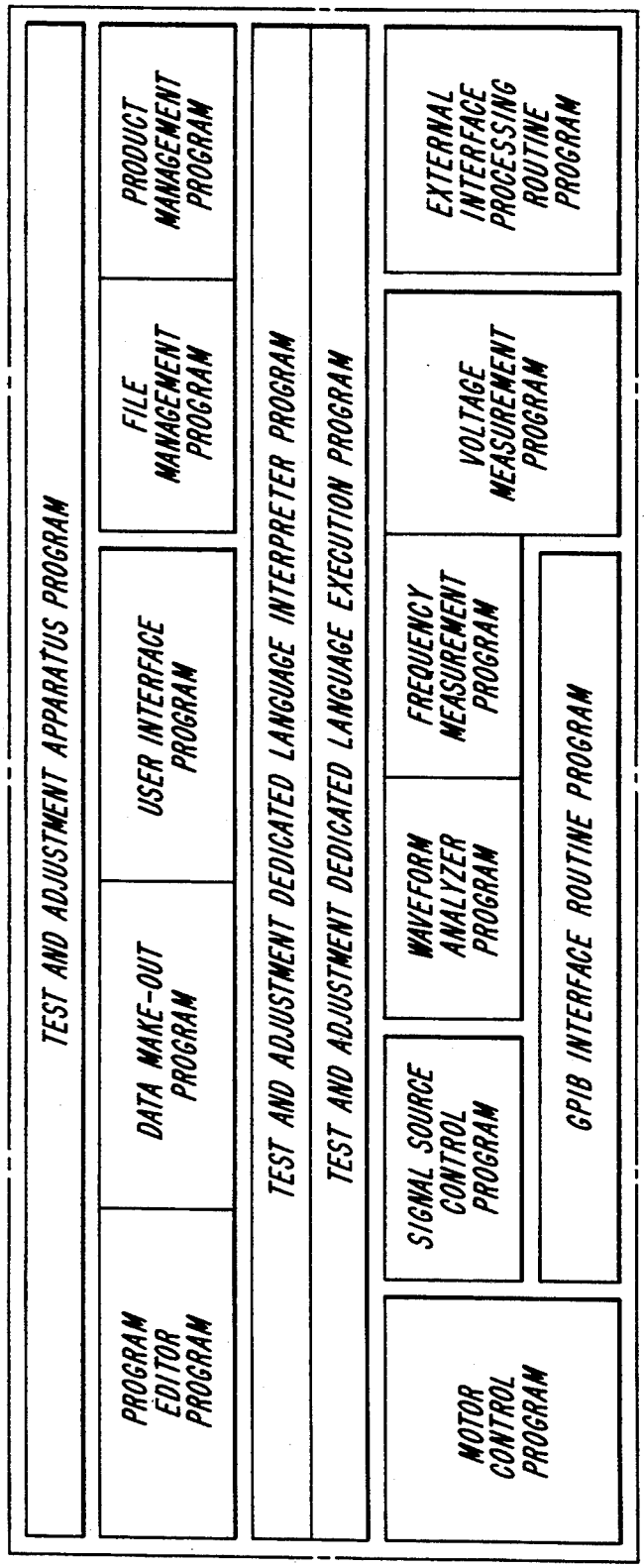
FIG. 3 shows a configuration of software programs stored in a computer unit in FIG. 2.

Various software programs for the waveform test and adjustment are configured in the computer unit 62 as shown in FIG. 3. The software programs in the computer unit 62 includes a program editor program, a data make-out program, a test and adjustment dedicated language interpreter program, a test and adjustment dedicated language execution program, a motor control program, a signal source control program, a waveform analyzer program, a frequency measurement program, a voltage measurement program, an external interface processing routine program and a GPIB interface routine program. In addition, the software programs include a user interface program, a file management program, and a product management program and the test. The user interface program is required to advance the control for the signal input and output and the waveform test and adjustment.

The printed wiring board remote controller means 18 is a means for remotely controlling the printed wiring board 2 and is under the control of the computer means 14. The printed wiring board remote controller means 18 includes a pattern generator 68 for receiving the printed wiring board operation start command signal from the computer means 14 and outputting an operation signal to the printed wiring board 2 in response to the operation start signal; a programmable power supply 70 for receiving the printed wiring board operation start command signal from the computer means 14 and supplying power to the printed wiring board 2 in response to the operation start signal; and a swemar generator 72 for receiving the printed wiring board operation start command signal from the computer means 14 and putting marks on the operation signals from the printed wiring board 2 in response to the operation start signal so that the measurement means 20 can measure gain values of desired frequency band when the operated signals from the printed wiring board 2 are gain values of high frequency signals.

In accordance with the preferred embodiment of the present invention, the measurement means 20 may be an oscilloscope.

The adjustment motor select means 28 includes a plurality of cylinder driving units 74 having solenoid coils for selectively conducting in response to the adjustment motor select signals outputted via the second interface means 12 from the computer means 14; and a plurality of cylinders 76 being reciprocated by the corresponding cylinder driving units 74 to connect/disconnect the corresponding adjustment motors 24 to/from the corresponding adjustment terminals 26 of the printed wiring board 2.

The operation of the waveform testing and adjusting apparatus with the above-mentioned construction in accordance with the present invention will hereinafter be described in detail with reference to FIGS. 5(a) through 5(e) which together make up a flowchart illustrating the operation of the apparatus in accordance with the embodiment of the present invention.

First, when a power switch (not shown) is turned on by the user, power is supplied to the computer unit 62 in the computer means 14 and the program logic controller 30 in the program logic controller means 6, at a step S1. Then, when an operating switch (not shown) on the first key input means 4 is turned on by the user, a drive signal from the program logic controller 30 is applied to conveyor belt driving means (not shown). In response to the drive signal from the program logic controller 30, the conveyor belt driving means operates the conveyor belt to locate the printed wiring board 2 at the waveform testing and adjusting position. Upon location of the printed wiring board 2 at the waveform testing and adjusting position, the operation of the conveyor belt driving means is stopped, at a step S2. The program logic controller 30 also outputs an operating signal to the solenoid means, not shown. In response to the operating signal from the program logic controller 30, the solenoid means raises the connection unit 8 so that the connection unit 8 and the printed wiring board 2 are interconnected, at a step S3.

At a step S4, the connection completion signal indicating that the connection unit 8 and the printed wiring board 2 have been interconnected is applied from the program logic controller 30 to the computer unit 62, which waits in the automatic mode set by a batch file upon the above power-on. Upon receiving the connection completion signal from the program logic controller 30, the computer unit 62 is driven by the user interface program which is pre-selected and loaded therein, at a step S5.

At a step S6, the computer unit 62 outputs an operating signal to the pattern generator 68 and the power supply 70 in the printed wiring board remote controller means 18 via the GPIB circuit 56 in the second interface means 12. In response to the operating signal from the computer unit 62, the pattern generator 68 outputs an operating signal to the printed wiring board 2 via the connection unit 8 and the power supply 70 supplies a power to the printed wiring board 2 via the connection unit 8.

As a result, circuits on the printed wiring board 2 begin to be operating and the operated signals from the circuits are applied to the measurement means 20 via the connection unit 8 and the multiplex circuit 38 in the first interface means 10, at a step S7. At a step S8A, the measured values of the operating signals from the circuits on the printed wiring board 2 are applied from the measurement means 20 to the computer unit 62 via the GPIB circuit 56 and the first extended interface circuit 50 in the second interface means 12 and the second extended interface circuit 78 in the computer unit 62.

The computer unit 62 discriminates at a step S8B whether only the test item for the printed wiring board 2 has been specified or all the test and adjustment items for the printed wiring board 2 have been specified. If it is discriminated at the step S8B that all the test and adjustment items for the printed wiring board 2 have been specified, the operation proceeds to a step S9.

At the step S9, the computer unit 62 compares the measured values from the measurement means 20 with the corresponding predetermined values preset in its internal memory to discriminate whether the difference values are within the range of corresponding predetermined errors.

The discrimination at the step S9 that the difference values are within the range of the corresponding predetermined errors means the normal operation of the printed wiring board 2. In this case, the operation proceeds to a step S10 in which the computer unit 62 outputs a display signal to the monitor 64. In response to the display signal, the monitor 64 displays that the printed wiring board 2 is normal and good.

At a step S11, the computer unit 62 outputs an operation stop signal to the pattern generator 68 and the power supply 70 in the printed wiring board remote controller means 18 via the first extended interface circuit 50 and the GPZB circuit 56 in the second interface means 12. In response to the operation stop signal from the computer unit 62, the pattern generator 68 outputs no operating signal to the printed wiring board 2 and the power supply 70 supplies no power to the printed wiring board 2.

At a step S12, a signal indicating that the waveform test and adjustment for the printed wiring board 2 have been completed and the printed wiring board 2 is good is applied from the computer unit 62 to the program logic controller 30 via the first extended interface circuit 50 and the second computer interface circuit 52 in the second interface means 12, the first computer interface circuit 36 and the input/output circuit 40 in the first interface means 10 and the main circuit 34 in the program logic controller means 6.

Upon receiving the above signal from the computer unit 62, the program logic controller 30 outputs an operating signal to the solenoid means, not shown. In response to the operating signal from the program logic controller 30, the solenoid means lowers the connection unit 8 so that the connection unit 8 and the printed wiring board 2 are disconnected.

At a step S13A, the drive signal from the program logic controller 30 is applied to the conveyor belt driving means. In response to the drive signal from the program logic controller 30, the conveyor belt driving means operates the conveyor belt to transfer the above printed wiring board 2 to the next process and locate a new printed wiring board 2 at the waveform testing and adjusting position. The above operation is performed repeatedly for the new printed wiring board 2 located at the waveform testing and adjusting position.

On the other hand, if it is determined at the step S8B that only the test item for the printed wiring board 2 has been specified, the operation proceeds to a step S13B. At the step 813B, the computer unit 62 compares the measured values from the measurement means 20 with the corresponding predetermined values preset in its internal memory to determine whether the difference values are within the range of the corresponding predetermined errors.

The determination at step S13B that the difference values are within the range of the corresponding predetermined errors means that the printed wiring board 2 is operating normally. In this case, the operation proceeds to the step S10 in which the computer unit 62 outputs the display signal to the monitor 64. In response to the display signal, the monitor 64 displays that the printed wiring board 2 is normal and good. Then, the operation is performed beginning with the step S11.

On the other hand, if it is discriminated at the step S13B that the difference values are not within the range of the corresponding predetermined errors, the operation proceeds to a step S29 in which the program logic control let 30 outputs the operating signal to the solenoid means. In response to the operating signal from the program logic controller 30, the solenoid means lowers the connection unit 8 so that the connection unit 8 and the printed wiring board 2 are disconnected. Then at a step S30, the program logic controller 30 outputs the drive signal to the conveyor belt driving means. In response to the drive signal from the program logic controller 30, the conveyor belt driving means operates the conveyor belt to move the printed wiring board to a desired distance.

At a step S31, the program logic controller 30 outputs an operating signal to marking means (not shown) so that the marking means puts an "inferior goods" mark on a certain portion of the top surface of the printed wiring board 2. Then at a step S32, the program logic controller 30 outputs the drive signal to the conveyor belt driving means. In response to the drive signal from the program logic controller 30, the conveyor belt driving means operates the conveyor belt to transfer the above printed wiring board 2 to an inferior goods loading place and locate a new printed wiring board 2 at the waveform testing and adjusting position.

The discrimination at the step S9 that the difference values are not within the range of the corresponding predetermined errors, i.e., measured value—predetermined value > predetermined error, means that there is a necessity for adjusting the waveforms from the printed wiring board 2. In this case, the operation proceeds to a step S14 in which the computer unit 62 sets a count stored in its internal memory to zero. The count stored in the memory of the computer unit 62 is a variable indicative of the lapse of time. Then at a step S15, a control signal from the computer unit 62 is applied to the cylinder driving units 74 in the adjustment motor select means 28 via the second extended interface circuit 78 in the computer unit 62 and the first extended interface circuit 50, the JPC circuit 54 and the GPIB circuit 56 in the second interface means 12. In response to the control signal from the computer unit 62, the solenoid coils in the cylinder driving units 74 conduct, thereby causing the cylinders 76 to be moved so that the adjustment motors 24 formed integrally with the corresponding cylinders 76 are connected to corresponding portions of the printed wiring board 2 to be adjusted, at a step 816.

Then at a step S17, the adjustment signals are applied from the computer unit 62 to the adjustment motor driving circuit 22 via the second extended interface circuit 78 in the computer unit 62 and the first extended interface circuit 50, the JPC circuit 54 and the GPIB circuit 56 in the second interface means 12. In response to the adjustment signals from the computer unit 62, the adjustment motor driving circuit 22 supplies a voltage to the adjustment motors 24 to rotate them, at a step S18. With the rotation of the adjustment motors 24, the corresponding adjustment terminals 26 on the printed wiring board 2 are rotated, so that the operations of the circuits of the printed wiring board 2 are varied.

The varied, operation signals from the circuits of the printed wiring board 2 are applied to the measurement means 20 via the connection unit 8 and the multiplex circuit 38 in the first interface means 10, at a step S19. The measured values of the varied, operation signals from the printed wiring board 2 are then applied from the measurement means 20 to the computer unit 78 via the GPIB circuit 56 and the first extended interface circuit 50 in the second interface means 12 and the second extended interface circuit 78 in the computer unit 62, at a step S20.

Then at a step S21, the computer unit 62 compares the measured values from the measurement means 20 with the corresponding predetermined values preset in its internal memory to discriminate whether the difference values are within the range of the corresponding predetermined errors, i.e., measured value—predetermined value $\leq$ predetermined error.

The discrimination at the step S21 that the difference values are within the range of the corresponding predetermined errors means the normal operation of the printed wiring board 2. In this case, the operation proceeds to a step S22 in which the computer unit 62 outputs the display signal to the monitor 64 and outputs adjustment stop signals to the adjustment motor driving circuit 22 via the second extended interface circuit 78 in the computer unit 62 and the first extended interface circuit 50, the JPC circuit 54 and the GPIB circuit 56 in the second interface means 12. In response to the display signal, the monitor 64 displays that the printed wiring board 2 is normal and good. Also, in response to the adjustment stop signals, the adjustment motor driving circuit 22 supplies no power to the adjustment motors 24 so that the rotation of the adjustment motors 24 are stopped.

The operation then proceeds to a step S23 in which the computer unit 62 outputs the operation stop signal to the pattern generator 68 and the power supply 70 in the printed wiring board remote controller means 18.

Then at a step S24, the control signal from the computer unit 62 is applied to the cylinder driving units 74 in the adjustment motor select means 28 via the JPC circuit 54 and the GPIB circuit 56 in the second interface means 12. In response to the control signal from the computer unit 62, the solenoid coils in the cylinder driving units 74 conduct, thereby causing the cylinders 76 to be moved so that the adjustment motors 24 are disconnected from the printed wiring board 2. The operation then proceeds to the step S12.

The discrimination at the step S21 that the difference values are not within the range of the corresponding predetermined errors, i.e., measured value—predetermined value>predetermined error, means that the wave adjustment for the printed wiring board 2 has not been completed. In this case, the operation proceeds to a step S25 in which the computer unit 62 sets the count to a new value obtained by adding one to the previous count value. Then at a step S26, the computer unit 62 discriminates whether the count value is in accord with a predetermined value NP such as, for example, 400. The discrimination at the step S26 that the count value is in accord with the predetermined value NP means that the adjustment desired by the user is not made although the adjustment for the printed wiring board 2 has been performed a large number of times. In this case, the operation proceeds to a step S27 in which the computer unit 62 outputs the adjustment stop signals to the adjustment motor driving circuit 22 and outputs the operation stop signal to the pattern generator 68 and the power supply 70 in the printed wiring board remote controller means 18. Also at the step S27, the computer unit 62 outputs to the monitor 64 a display signal indicating that the printed wiring board 2 is inferior goods incapable of adjusting the waveforms of the audio/video signals.

Then at a step S28, the control signal from the computer unit 62 is applied to the cylinder driving units 74 in the adjustment motor select means 28 via the JPC circuit 54 and the GPIB circuit 56 in the second interface means 12. In response to the control signal from the computer unit 62, the solenoid coils in the cylinder driving units 74 conduct, thereby causing the cylinders 76 to be moved so that the adjustment motors 24 are disconnected from the printed wiring board 2.

The operation then proceeds to the step S29 in which the program logic controller 30 outputs the operating signal to the solenoid means. In response to the operating signal from the program logic controller 30, the solenoid means lowers the connection unit 8 so that the connection unit 8 and the printed wiring board 2 are disconnected. Then at the step S30, the program logic controller 30 outputs the drive signal to the conveyor belt driving means. In response to the drive signal from the program logic controller 30, the conveyor belt driving means operates the conveyor belt to move the printed wiring board 2 to a desired distance. Also at the step S31, the program logic controller 30 outputs the operating signal to the marking means (not shown) so that the marking means puts an "inferior goods" mark on a certain portion of the top surface of the printed wiring board 2. Then at the step S32, the program logic controller 30 outputs the drive signal to the conveyor belt driving means. In response to the drive signal from the program logic control let 30, the conveyor belt driving means operates the conveyor belt to transfer the above printed wiring board 2 to the inferior goods loading place and locate a new printed wiring board 2 at the waveform testing and adjusting position.

On the other hand, the discrimination at the step S26 that the count value is not in accord with the predetermined value NP means that there is a necessity for performing the waveform adjustment for the printed wiring board 2 a few more times. In this case, the operation proceeds to the step S17 to perform the above-mentioned waveform adjustment repeatedly.

As mentioned above, in the apparatus for testing and adjusting the audio/video signal waveforms in the color television in accordance with the embodiment of the present invention, the waveform test and adjustment for the printed wiring board 2 are performed by the computer unit 62, the program logic controller 30, the measurement means 20 and the first and second interface means 10 and 12, resulting in reduction in an inferiority rate and a labor cost in manufacturing the goods.

On the other hand, in accordance with an alternative embodiment of the present invention, connected to the adjustment motors 24 may be adjustment motor moving means 80 which is designated by a single-dotted line in FIGS. 1 and 2. The adjustment motor moving means 80 acts to receive a position signal from the computer unit 62 when at least one of the measured values of the operated signals from the printed wiring board 2 is different from the corresponding predetermined value preset in the computer unit 62 and move a corresponding one of the adjustment motors 24 to a position of the printed wiring board 2 to be adjusted, in response to the position signal.

The adjustment motor moving means 80 includes a plurality of XY table driving circuits 82 for receiving the adjustment motor select signals via the second interface means 12 from the computer unit 62 and rotating X-axis and Y-axis motors (not shown) corresponding to the adjustment motor select signals and a plurality of XY tables 84 being operated by the corresponding XY table driving circuits 82 to move the adjustment motors 24 selected by the computer unit 62 to the positions of the printed wiring board 2 to be adjusted.

When it is discriminated at the step S9 or S21 that the difference values are nob within the range of the corresponding predetermined errors in the computer unit 62, the position signals from the computer unit 62 are applied to the XY table driving circuits 82 in the adjustment motor moving means 80 via the second extended interface circuit 78 in the computer unit 62 and the first extended interface circuit 50, the JPC circuit 54 and the GPZB circuit 56 in the second interface means 12. In response to the position signals from the computer unit 62, the XY table driving circuits 82 operate the XY tables 84 to move the adjustment motors 24 selected by the computer unit 62 to the positions of the printed wiring board 2 to be adjusted.

Then, the control signal from the computer unit 62 is applied to the cylinder driving units 74 in the adjustment motor select means 28 via the second extended interface circuit 78 in the computer unit 62 and the first extended interface circuit 50, the JPC circuit 54 and the GPIB circuit 56 in the second interface means 12. In response to the control signal from the computer unit 62, the solenoid coils in the cylinder driving units 74 conduct, thereby causing the cylinders 76 to be moved so that the adjustment motors 24 formed integrally with the corresponding cylinders 76 are connected to the corresponding portions of the printed wiring board 2 to be adjusted. With repetition of the above operation, the waveform adjustment for many positions of the printed wiring board 2 can be performed by a smaller number of adjustment motors. The subsequent operation is the same as that in the first embodiment.

As mentioned above, in accordance with the second embodiment of the present invention, with the adjustment motor moving means 80 including the XY tables 84, the waveform adjustment for many positions of the printed wiring board 2 can be performed by a smaller number of adjustment motors.

Although the apparatus for testing and adjusting the audio/video signal waveforms in the color television has been disclosed herein, the present invention may be applied to test and adjustment for audio/video signal waveforms in a video tape recorder and test and adjustment for an audio signal waveform in an audio system.

As hereinbefore described, in accordance with the present invention, the waveform test and adjustment for the printed wiring board are performed by the computer unit, the program logic controller, the measurement means and the first and second interface means, resulting in reduction in an inferiority rate and a labor cost in manufacturing the goods. Also, according to the present invention, a torque of the adjustment motor is controlled by the program stored in the computer unit such that it is not above a predetermined value. This has the effect of preventing a component to be adjusted from being damaged. Moreover, there can be adjusted simultaneously a plurality of contacts on the printed wiring board which output the audio/video signals of the color television, resulting in minimization of the adjustment time. Furthermore, the data regarding the waveform test and adjustment for the printed wiring boards of various models of the color televisions are stored in the computer unit so that the waveform test and adjustment for the printed wiring board of any model of the color television can be performed readily. Also, the communication with a computer of the preceding or subsequent process or a computer of high order level enables the off-line/in-line combination. Further, the program logic controller and the computer unit each has a data back-up function of preserving the present data although the power is turned off by chance while operating. As a result, the work can be performed continuously when the power is again turned on.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for testing and adjusting audio/video signal waveforms in television, comprising:
    means for testing audio/video waveforms in a printed wiring board and for outputting a test result;
    means for electrically connecting said testing means to said printed wiring board;
    means for determining a degree circuit parameters are to be adjusted in accordance with said result of said testing means; and
    means for electromechanically adjusting circuit parameters of said printed wiring board in accordance with said adjustment determined by said determining means.

2. An apparatus according to claim 1, wherein said adjusting means includes a plurality of adjustment motors for rotating a corresponding one of a plurality of adjustment terminals on said printed wiring board.

3. An apparatus in accordance with claim 1, wherein said connecting means includes:
    first key input means for inputting a user's command signal regarding transfer of a printed wiring board from which the audio/video signal waveforms of the television are output.

4. An apparatus in accordance with claim 1, wherein said connecting means further includes:
    program logic controller means for operating a conveyor belt to locate said printed wiring board at a waveform testing and adjusting position.

5. An apparatus in accordance with claim 1, wherein said connecting means further includes:
    a connection unit connected to said printed wiring board in cooperation with a solenoid mechanism for connecting said testing means to said printed wiring board when said printed wiring board is located at a waveform testing and adjusting position.

6. An apparatus in accordance with claim 5, wherein said program logic controller means includes:
    a program logic controller for receiving a user's printed wiring board transfer command signal and outputting a control signal to operate a conveyor belt and said connection unit in response to a transfer command signal; and
    a main circuit for transferring the control signal from said program logic controller to a second interface means and transferring system operated signals from said second interface means to said program logic controller.

7. An apparatus in accordance with claim 5, wherein said testing means includes:
    first interface means for receiving from said program logic controller means a signal indicating that said connection unit and said printed wiring board have been interconnected.

8. An apparatus in accordance with claim 7, wherein said first interface means includes:
    a first computer interface circuit for interfacing circuits in said first interface means to a computer means;
    a multiplexer circuit for selecting at least one of a plurality of contacts of said printed wiring board in response to a control signal from said computer means, outputting a signal indicative of the selected contact to said connection unit and transferring to said measurement means the operated signals which are outputted from said printed wiring board via said connection unit;
    an input/output circuit for receiving the control signal from said program logic controller means and outputting the system operated signals to said program logic controller means;
    a video/audio buffer circuit for amplifying video/audio adjustment condition signals from said computer means and outputting the amplified signals to said connection unit; and
    a relay driving circuit responsive to the control signal from said computer means for operating relays to connect circuit components for setting particular adjustment conditions to said contacts of said printed wiring board.

9. An apparatus in accordance with claim 7, wherein said testing means includes:
  second interface means for receiving from said first interface means the signal indicating that said connection unit and said printed wiring board have been interconnected;
  computer means for receiving from said second interface means the signal indicating that said connection unit and said printed wiring board have been interconnected; and
  second key input means for inputting a user's control command signal regarding the waveform test and adjustment for said printed wiring board and outputting the control command signal to said computer means.

10. An apparatus in accordance with claim 9, wherein said second interface means includes:
  a demultiplexer circuit for communicating with a multiplexer circuit in said first interface means;
  a first extended interface circuit for communicating with a second extended interface circuit included in a computer unit in said computer means to transfer the control signal from said computer means to other circuits in said second interface means;
  a second computer interface circuit for communicating with a first computer interface circuit in said first interface means;
  a joint position controller circuit responsive to the control signal from said computer means for outputting adjustment motor select signals to rotate adjustment motors selected by said computer means;
  an interface bus circuit for transferring the adjustment motor select signals from said joint position controller circuit to an adjustment motor select means, transferring the printed wiring board operation start command signal from said computer means to a printed wiring board remote controller means and a measurement means and transferring the measured values of the printed wiring board operated signals from said measurement means to said computer means;
  a counter circuit for transferring the measured values of the printed wiring board operated signals from said measurement means to said computer means when the measured values are signals of high frequency; and
  a voltage module circuit for receiving the operated signals from said printed wiring board directly for reduction of time when the operated signals are voltage signals of low frequency and outputting the operated signals to said computer means.

11. An apparatus in accordance with claim 9, wherein said computer means includes:
  a computer unit for receiving from said program logic controller means the signal indicating that said connection unit and said printed wiring board have been interconnected and performing control of waveform test and adjustment for said printed wiring board;
  a monitor for receiving a signal as a result of the waveform test for said printed wiring board from said computer unit and displaying the received signal as a video image; and
  a printer for receiving data as a result of the waveform test and adjustment for said printed wiring board from said computer unit and printing received data.

12. An apparatus in accordance with claim 9, wherein said testing means includes:
  printed wiring board remote controller means for receiving a printed wiring board operation start command signal from said computer means via said second interface means and operating said printed wiring board via said connection unit in response to the operation start command signal.

13. An apparatus in accordance with claim 12, wherein said printed wiring board remote controller means includes:
  a pattern generator for receiving the printed wiring board operation start command signal from said computer means and outputting an operating signal to said printed wiring board in response to the operation start signal;
  a programmable power supply for receiving the printed wiring board operation start command signal from said computer means and supplying a power to said printed wiring board in response to the operation start signal; and
  a swemar generator for receiving the printed wiring board operation start command signal from said computer means and putting marks on the operated signals from said printed wiring board in response to the operation start signal so that said measurement means can measure gain values of desired frequency band when the operated signals from said printed wiring board are gain values of high frequency signals.

14. An apparatus in accordance with claim 5, wherein said testing means includes:
  measurement means for receiving operated signals from said printed wiring board via said connection unit and said first interface means when said printed wiring board is operated and outputting measured values of the operated signals from said printed wiring board.

15. An apparatus in accordance with claim 14, wherein said measurement means is an oscilloscope.

16. An apparatus in accordance with claim 9, wherein said adjusting means includes:
  an adjustment motor driving circuit for receiving adjustment signals from said computer means, the adjustment signals each corresponding to a difference value when a corresponding one of the measured values of the operated signals from said printed wiring board is different from a corresponding predetermined value preset in said computer means.

17. An apparatus in accordance with claim 16, wherein said adjusting means includes:
  a plurality of adjustment motors each being rotated in response to a corresponding one of rotation signals from said adjustment motor driving circuit to rotate a corresponding one of a plurality of adjustment terminals on said printed wiring board corresponding to a difference value when a corresponding one of the measured values of the operated signals from said printed wiring board is different from a corresponding predetermined value preset in said computer means.

18. An apparatus in accordance with claim 17, wherein said adjusting means includes:

adjustment motor select means for receiving an adjustment motor select signal from said computer means when at least one of the measured values of the operated signals from said printed wiring board is different from a corresponding predetermined value preset in said computer means, selecting one of said adjustment motors corresponding to a position of said printed wiring board to be adjusted, in response to the adjustment motor select signal, and connecting the selected adjustment motor to said printed wiring board.

19. An apparatus in accordance with claim 18, wherein said adjustment motor select means includes:
- a plurality of cylinder driving units having solenoid coils for selectively conducting in response to the adjustment motor select signals outputted from said computer means; and
- a plurality of cylinders being reciprocated by the corresponding cylinder driving units to connect-/disconnect the corresponding adjustment motors to/from the corresponding adjustment terminals of said printed wiring board.

20. An apparatus according to claim 17, wherein said adjusting means includes:
- adjustment motor moving means for receiving a position signal when at least one of the measured values of operated signals from said printed wiring board is different from a corresponding predetermined value preset and moving a corresponding one of said adjustment motors to a position of said printed wiring board to be adjusted, in response to the position signal.

21. An apparatus according to claim 20, wherein said adjustment motor moving means includes:
- a plurality of XY table driving circuits for receiving the adjustment motor select signals and rotating X-axis and Y-axis motors corresponding to the adjustment motor select signals; and
- a plurality of XY tables being operated by corresponding XY table driving circuits to move ones of said adjustment motors to positions of said printed wiring board to be adjusted.

* * * * *